United States Patent [19]

Hurley et al.

[11] 3,961,251

[45] June 1, 1976

[54] TESTING EMBEDDED ARRAYS

[75] Inventors: William J. Hurley, Poughkeepsie; Hans P. Muhlfeld, Highland, both of N.Y.

[73] Assignee: International Business Machines Corporation, Armonk, N.Y.

[22] Filed: Dec. 20, 1974

[21] Appl. No.: 534,605

[52] U.S. Cl. .................... 324/73 AT; 235/153 AC; 235/153 AK
[51] Int. Cl.² .......................................... G01R 15/12
[58] Field of Search .................... 324/73, 51, 158 R; 235/153 AC, 153 AK, 153 AM; 340/174 ED

[56] References Cited
UNITED STATES PATENTS

| | | | |
|---|---|---|---|
| 3,387,276 | 6/1968 | Reichow ........................ | 235/153 AK |
| 3,758,761 | 9/1973 | Henrion ........................ | 235/153 AK |

Primary Examiner—R. V. Rolinec
Assistant Examiner—Michael J. Tokar
Attorney, Agent, or Firm—Joseph L. Spiegel

[57] ABSTRACT

A large scale integrated (LSI) chip or semiconductor device includes a memory array and associated logic circuitry. The array is "embedded" in the sense that it is not directly accessible, either in whole or in part, from the input and output terminals or pads of the device. To facilitate testing there is added to the device gating means to the memory array and wiring extending from primary access points of the device to the memory array bypassing and in parallel with the logic circuitry. The device further includes control means operatively associated with the gating means for switching the input to the array between the logic circuitry and the primary access points. In the latter condition direct access to the array is permitted, thereby facilitating testing.

9 Claims, 2 Drawing Figures

TESTING EMBEDDED ARRAYS

BACKGROUND OF THE INVENTION

1. Field of the Invention

This invention relates semiconductor devices so designed and arranged as to facilitate the testing of same. While not so limited the invention is primarily concerned with large scale integrated (LSI) chip or semiconductor devices having memory arrays and similar devices embedded therein.

For purposes of discussion the term "embedded" is defined as that condition of a memory array, circuit element or even a circuit function on an LSI chip, when surrounded by other circuitry on the chip, such that the memory array, circuit element or circuit function is not directly accessible, either in whole or in part, from the input and output terminals or pads of the chip.

A prime problem associated with such devices is the testing of the embedded array and, in particular, in getting the proper test data and address words to the array inputs. When there is a substantial amount of logic surrounding the array the problem is determining what input pattern or sequence of input patterns, if any, can be applied to the primary inputs of the device in order to get the correct pattern at the array, and, thereafter, to obtain meaningful test data results from the device output.

With the advent of large scale integration, the circuit designer as well as the component manufacturer are provided with the ability to greatly increase the number of circuits on a single chip of semiconductor material. But unless some means is provided for permitting testing of circuitry embedded within the chip, further increases in circuit density can not be expected.

2. Description of the Prior Art

Of course, the problem of testing LSI chips has been addressed before. One example, is the level sensitive testing technique of E. B. Eichelberger, U.S. Pat. No. 3,761,695 issued Sept. 25, 1973 and assigned to the same assignee as the present invention. M. T. McMahon, Jr., U.S. Pat. No. 3,781,670, issued Dec. 25, 1973, and assigned to the same assignee as the present invention allows a.c. performance testing of an LSI chip during fabrication. R. L. James, U.S. Pat. No. 3,789,205, issued Jan. 29, 1974, and assigned to the same assignee as the present invention, teaches testing individual chips mounted on a planar board while the chips are interconnected so as to perform a desired logical function by electronically isolating the chips and applying test patterns to the input lines of the chips to be tested.

Still other techniques addressing the problem of testing LSI chips are disclosed in: R. L. James, U.S. Pat. No. 3,790,885, issued Feb. 5, 1974 and assigned to the same assignee as the present invention; T. H. Baker, et al, U.S. Pat. No. 3,762,037 issued Oct. 2, 1973 and assigned to the same assignee as the present invention; and, DeWolf, U.S. Pat. No. 3,772,595, issued Nov. 13, 1973.

None of the above, however, provide a solution for the testing of embedded arrays.

SUMMARY OF THE INVENTION

An object of the invention is an LSI semiconductor device of high circuit density.

Another object is such a device allowing testing of memory arrays and the like embedded within said device.

Still another object is such a device that allows array testing using conventional memory test equipment.

A further object is fabrication of LSI semiconductor devices in such manner as to facilitate testing.

These and other objects are accomplished in accordance with the present invention, one illustrative embodiment of which comprises adding gating means to the memory array of an LSI chip or semiconductor device whose array is embedded by reason of its being surrounded by logic circuitry between it and the primary access points to the device, bypassing the logic circuitry with wiring extending directly from the primary access points of the device to the memory array gating means and providing control means for switching the input to the array between the logic circuitry and the primary access points. In the latter condition direct access to the array is permitted thereby facilitating testing.

BRIEF DESCRIPTION OF THE DRAWING

The foregoing and other objects, features and advantages of the invention will be apparent from the following, more particular description of the present invention, as illustrated in the accompanying drawing, wherein.

DESCRIPTION OF THE PREFERRED EMBODIMENTS

Figure 1:
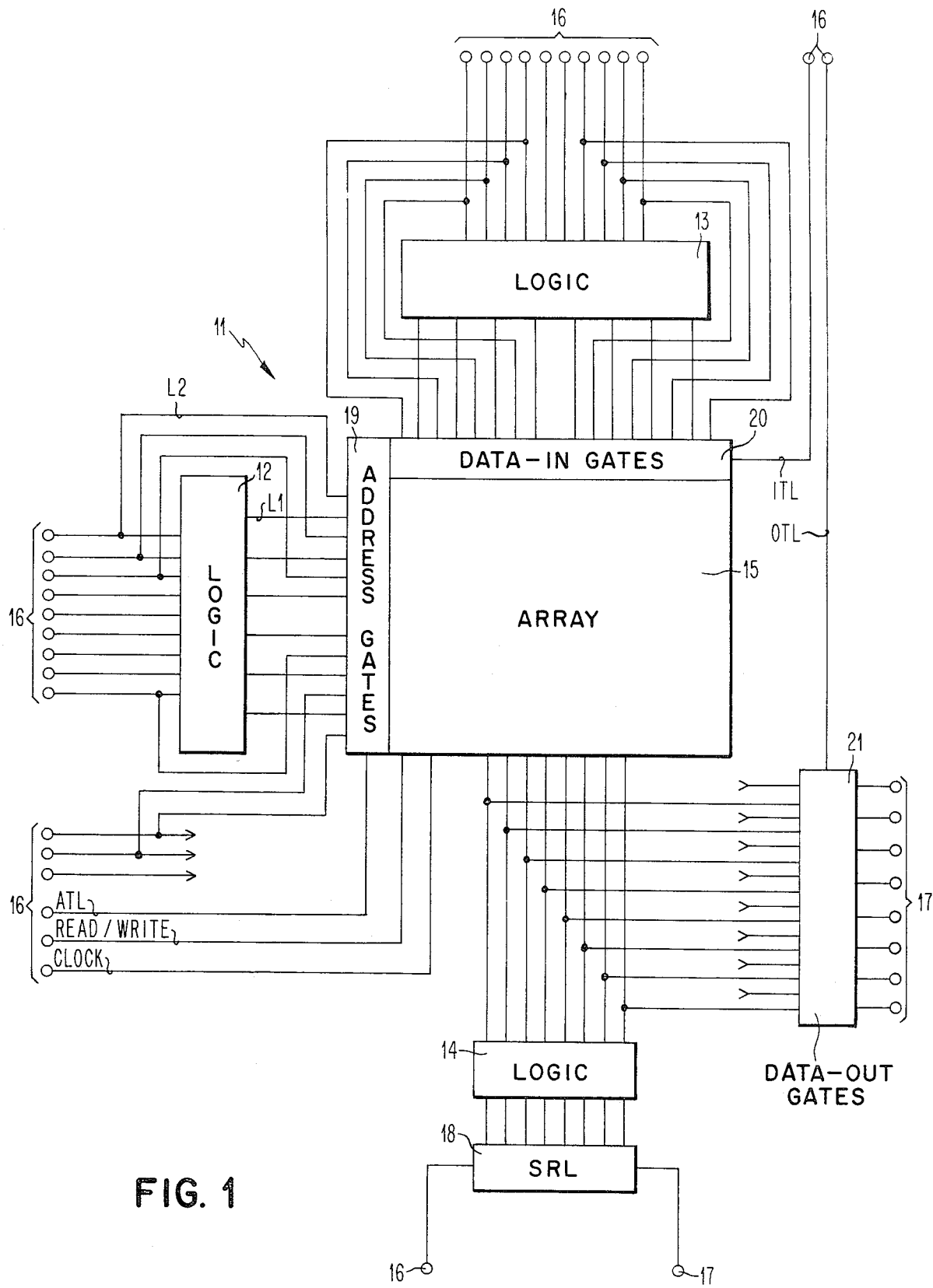
FIG. 1 is a simplified block diagram of an LSI chip or semiconductor device in accordance with the teachings of the present invention.

Referring now to FIG. 1 there is illustrated in simple, block diagram form an LSI chip or semiconductor device 11 in accordance with the teachings of the present invention.

Chip 11 typically includes a plurality of logic circuits 12, 13, 14 and a memory array 15.

Each of the logic circuits 12–14 may comprise any combination of logic, for example, registers, decoders, etc.

The memory array 15 may typically be 64 × 8, meaning 64 addresses each 8 bits. The invention is not size limited, however, and is applicable to either smaller or larger arrays as well.

Primary inputs to logic circuits 12, 13 and to other logic circuitry on the chip (not shown) are designated generally by the reference numeral 16, while primary outputs from device 11 are designated generally by reference numeral 17.

The device 11 further includes shift register latches 18 associated with logic circuitry 14, a line from a primary input 16 for permitting one to scan data into the shift register latches 18 and a line to a primary output 17 for scanning data out of latches 18. The shift register latches 18 permit one to look at the output of the logic circuitry 14.

A read-write line extends from a primary input 16 to the array 15 instructing the array to perform either a read or write operation. A clock line extends from a primary input 16 to the array 15 for providing a series of timed pulses to the array.

The device 11 as thus far described incorporates an embedded array 15. Thus, for example, lead lines extend from the primary inputs 16 to logic circuits 12, 13 and interconnecting lines extend between the circuits 12, 13, 14 to the memory array 15. But the memory array 15 is not directly accessible from the primary inputs 16 and outputs 17 of the device 11, due to the intervening logic circuitry 12, 13, 14.

To overcome these problems and in accordance with the teachings of the present invention, the array 15 is provided with address gates 19, data-in gates 20 and data-out gates 21 and the device 11 is provided with wiring that skirts the logic circuitry 12, 13, 14, thereby allowing direct access from the primary inputs 16 to the array 15 and from the array 15 to the primary outputs 17 without going through any of the logic circuitry 12, 13, 14.

The operation of the present invention is best illustrated with reference to FIG. 2. Let L1 be one of the interconnecting lines from the logic circuitry 12 feeding one of the address gates 19 within array 15. Let L2 be one of the skirting wires extending from a primary input 16 to one of the address gates 19 within array 15. It is the combination of this line L2 with the address gate 19 added to the array 15 that allows switching the actual inputs to the array 15 to either the logic circuitry 12 or directly to the primary input 16.

The address test line, designated ATL, running from a primary input 16 to the address gate 19 is a control line determining whether the actual input to the array 15 is from the logic circuitry 12 or directly from the primary input 16. That is, the test line ATL controls the gate 19 such that array 15 may interface either with the on-chip logic as the chip designer intends or with a tester directly through the primary inputs 16, as required in a testing mode.

Figure 2:
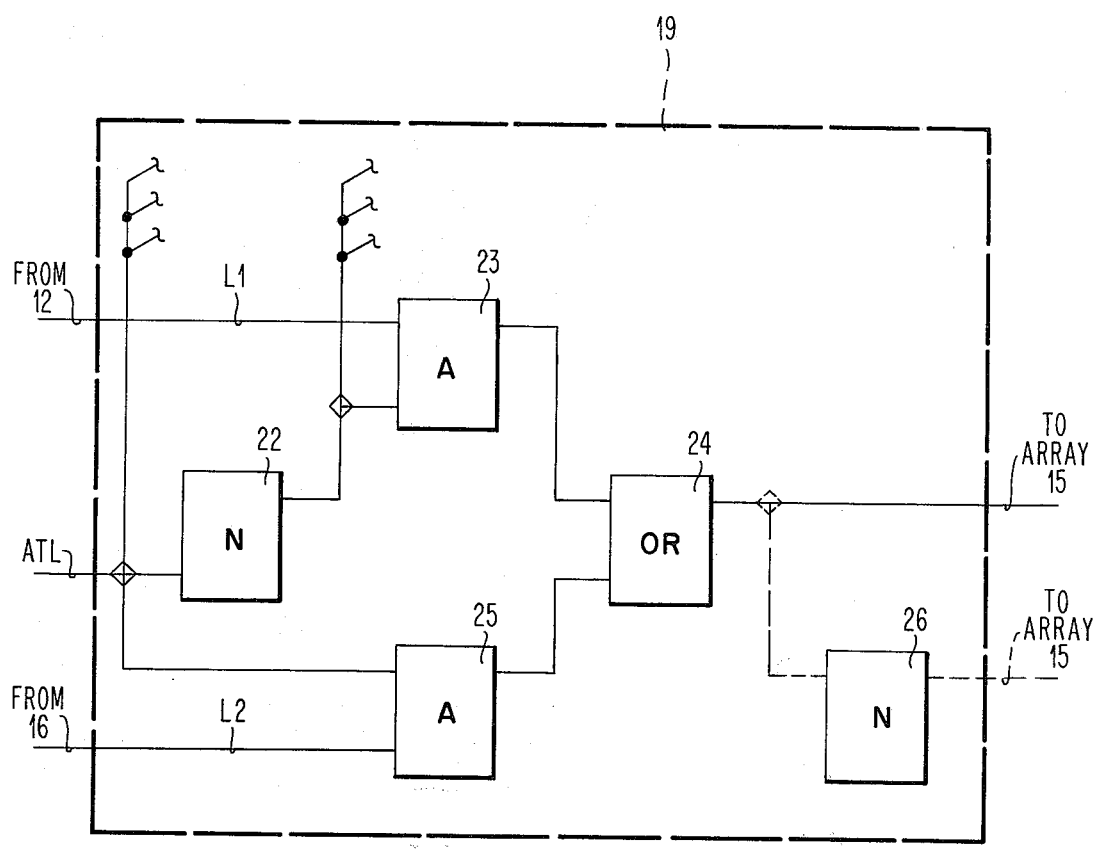
FIG. 2 is a simplified block diagram of those subassemblies of the FIG. 1 device required to illustrate the operation of the present invention.

The arrangement and operation of the primary inputs 16, logic circuitry 13 and data-in gates 20 added to array 15 are the same as that illustrated in FIG. 2 with the test line designated ITL acting as a control line.

The arrangement and operation of the primary outputs 17, logic circuitry 13 and data-out gates 21 added to array 15 are essentially the same as that illustrated in FIG. 2 with the test line OTL acting as a control line. There are lead lines extending into the data-out gates 21 directly from the array 15 as well as from other logic circuitry (not shown) on the chip.

Referring in particular to FIG. 2, the operation of the address gate 19 will be described. Normally, the test line ATL is negative causing the output of the N block 22 to be positive, and, in turn conditioning the top AND circuit 23. Thus any signal coming from logic circuitry 12 will pass through the AND circuit 23, be inverted and then pass through an OR circuit 24 to array 15. Any signal coming from a primary input 16 will be inhibited, since the lower AND circuit 25 is deconditioned. But when testing, test line ATL is positive. The top AND circuit 23 is deconditioned and the lower AND circuit 25 is conditioned. Thus any data on an existing primary input 16 is directly shunted into the array 15 via AND circuit 25 and OR circuit 24.

The address gate 19 is further provided, optionally, with an inverter circuit 26 on the output of the OR circuit 24 in those cases where both true and complement inputs to the array 15 are required.

By incorporating the gates as part of the array and wiring the gate inputs as shown, one can completely control the action of the array independent of any on-chip logic.

The primary inputs 16 for the address 19 and data-in gates 20 and the primary outputs 17 for the data-out gates 21 are not additional parts on the chip. Existing pads are time shared.

Other advantages to this invention include flexibility of addressing at fast cycle times with a concomitant savings of test time. The test pattern generation is simplified. Due to the time savings accrued more extensive testing of the array will be possible. There is a financial savings in test equipment due to increased throughput, plus the capability of using existing memory test equipment.

A further advantage flowing from this invention is that once the array has been tested, the array can be used to facilitate testing of the on-chip logic associated with the array. For example, and with reference to FIG. 1, the logic circuitry 12 preceding the address gate 19 may be tested by loading array 15 under the control test lines ATL and ITL with by-address data. The array becomes a stored table by which the logic 12 may be tested. Test conditions are applied to the logic 12 such that specific addresses are selected. Data from each selected address is read broadside from the chip under the control of the test lines ATL and OTL and compared against a table stored in the tester. Only the correct address will supply the expected data. In the case of read only memories, the pattern already exists and, therefore, the array need not be loaded.

The logic circuitry 13 preceding the data-in gates 20 may be tested by controlling the address gates 19 via the test line ATL while exercising the data input logic. Each output condition of logic 13 is then written into separate addresses of the array 15. The addresses are provided by the tester through address gates 19 from primary inputs 16. Once the test is completed, or the array is filled, broadside read-out, under control of test lines ATL and OTL, is initiated, and the stored results are compared in the tester.

Test time required to test the logic 14 following the array 15 can be reduced significantly by using the array for test pattern storage. It can be loaded broadside under the control of the test lines ITL and ATL thereby eliminating the need for scanning in these patterns into shift registers, although shift register latches and scan out may still be required to test the array data output logic where not all logic outputs are available at primary outputs.

It will be appreciated by persons skilled in the art that the logic circuitry depicted in the drawing by blocks 12, 13 and 14, respectively, may be comprised of combinatorial and sequential logic for performing a wide variation of logical functions. Stated alternatively the only restriction on the logic of block 13 is that its output provide suitable data inputs to the data-in gates 20. Corresponding the only restriction on the logic of block 12 is that its output provides the proper array addresses to address gates 19. Further, the logic depicted by block 14 may perform any desired logical function on the array data output.

It will be also appreciated that the clock R/W and whatever other control lines the array may require may be also generated by on chip logic thereby eliminating direct access to these array inputs. By inserting gates generally of the type represented by the circuitry of FIG. 2 at the array inputs, direct accessibility to the array is preserved.

Thus, while the invention has been particularly shown and described with reference to the preferred embodiment thereof, it will be understood by those skilled in the art that various changes in form and detail may be made without departing from the spirit and scope of the invention.

What is claimed is:

1. In an LSI semiconductor device comprising a memory array, associated logic circuitry and primary access points to and from external circuitry, operatively associated and so arranged as to provide no direct access from said primary access points to all portions of said memory array, the improvement comprising;

means bypassing said associated logic circuitry for loading a test pattern into said array directly from primary access points; and, means bypassing said associated logic circuitry for testing the output of said memory array.

2. The invention defined by claim 1 wherein said test pattern loading means includes wiring extending from said primary access points to said memory array in parallel with said logic circuitry.

3. The invention defined by claim 1 including means for inhibiting access between said associated logic circuitry and said memory array when in a test mode and for inhibiting said test pattern loading means when in an operative mode.

4. The invention defined by claim 3 wherein said inhibiting means includes gating means within said memory array and control means operatively associated with said gating means for switching the input to said array from said logic circuitry and said primary access points.

5. The invention defined by claim 1 wherein said output testing means includes wiring extending from said array to primary access points bypassing said logic circuitry.

6. The invention defined by claim 1 including means for inhibiting said associated logic circuitry when in a test mode and for inhibiting said output test means when in an operative mode.

7. The invention defined by claim 6 wherein said output testing means includes gating means and control means operatively associated with said gating means for switching the output to said primary access points from said logic circuitry and said output testing means.

8. In the method of testing an LSI semiconductor device that includes logic circuitry, a memory array and primary access points to and from external circuitry, operatively associated and so arranged as to provide no direct access from said primary access points to said memory array, the improvement which comprises:

bypassing said associated logic circuitry;

loading a test pattern directly into said array from said primary access points; and, testing the output of said memory array.

9. The invention defined by claim 8 including inhibiting said associated logic circuitry when in a test mode.

* * * * *